(12) United States Patent
Boerstler et al.

(10) Patent No.: US 6,501,313 B2
(45) Date of Patent: Dec. 31, 2002

(54) DYNAMIC DUTY CYCLE ADJUSTER

(75) Inventors: David William Boerstler, Round Rock, TX (US); Daniel Mark Dreps, Georgetown, TX (US); Byron Lee Krauter, Austin, TX (US); Hung Cai Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/749,335

(22) Filed: Dec. 27, 2000

(65) Prior Publication Data

US 2002/0079940 A1 Jun. 27, 2002

(51) Int. Cl.[7] .............................................. H03K 3/017
(52) U.S. Cl. ........................ 327/175; 327/276; 327/278; 327/534
(58) Field of Search ................................. 327/175, 534, 327/535, 537, 291, 293, 294, 276, 277, 278

(56) References Cited

U.S. PATENT DOCUMENTS

| | | | |
|---|---|---|---|
| 5,491,440 A | | 2/1996 | Uehara et al. |
| 5,712,884 A | * | 1/1998 | Jeong ........................... 375/375 |
| 5,757,218 A | * | 5/1998 | Blum ........................... 327/175 |
| 5,838,047 A | * | 11/1998 | Yamauchi et al. ........... 257/372 |
| 5,859,571 A | * | 1/1999 | Lee et al. ...................... 331/53 |
| 5,917,365 A | * | 6/1999 | Houston ...................... 327/534 |
| 6,084,452 A | | 7/2000 | Drost et al. |
| 6,125,157 A | * | 9/2000 | Donnelly et al. ............ 375/371 |

OTHER PUBLICATIONS

Gronowski, Paul E.,, et al., "A 433 Mhz 64b Quad–Issue RISC Microprocessor," ISSCC Digest Issue Feb. 1996, pp. 222–223, John H. Wuorinen, Castine, ME.

Jung, Yeon–Jae, et al., "A Low Jitter Dual Loop DLL using Multiple VCDLs with a Duty Cycle Corrector," VLSI Circuits Digest Issue Jun. 2000, pp. 50–51, Circuits Symposium, Honolulu.

Nakamura, Kazuyuki, et al., "A CMOS 50% Duty Cycle Repeater Using Complementary Phase Blending," VLSI Circuits Digest of Technical Papers Jun. 15–17, 2000, pp. 48–49, Circuits Symposium, Honolulu.

* cited by examiner

Primary Examiner—Timothy P. Callahan
Assistant Examiner—An T. Luu
(74) Attorney, Agent, or Firm—Casimer K. Salys; Bracewell & Patterson, L.L.P.

(57) ABSTRACT

A method of controlling a clock signal in a clock distribution network, by detecting an error in a duty cycle of the clock signal, and dynamically adjusting the body voltage of one or more devices in the clock distribution network, based on the detected error. Where the electronic device is a p-type device, the adjustment may be performed by reducing the body voltage of the p-type device with respect to a supply voltage. Where the electronic device is an n-type device, the adjustment may be performed by increasing the body voltage of the n-type device with respect to a reference plane. The invention may be implemented digitally, that is, with the body voltage of the electronic device being adjusted by selectively connecting a body contact of the device to one of several discrete voltages using a multiplexer. Alternatively, the invention may be implemented in an analog fashion, such as by applying an analog signal to the body contact, wherein the analog signal is generated using an asymmetric charge-pump and filter connected to the clock signal.

19 Claims, 6 Drawing Sheets

DYNAMIC DUTY CYCLE ADJUSTER

BACKGROUND OF THE INVENTION

1. Technical Field

The present invention generally relates to synchronized electronic systems, and more particularly to a method of dynamically adjusting the duty cycle of a clock signal in a digital computer system having a clock distribution network.

2. Description of Related Art

Many modern electronic systems require a precise clock circuit for proper operation. For example, digital information processing equipment such as a computer must have an accurate and reliable clock source to control the various signals that are sent between the functional components of the computer. In such systems, it is very important that all of the components are properly synchronized to a common clock.

Synchronous electronic equipment utilizes an oscillator circuit to produce a basic source frequency signal. This signal is in turn utilized to drive other circuitry (such as a phase-lock loop, or PLL) for developing desired rise and fall times of square-wave signals, and desired signal levels. The clock rate requirements for timing digital information processing systems are generally proportional to the switching speeds of the circuitry employed. As clock circuits improve and clock rates increase, tolerances are necessarily diminished, and clock skew becomes an ever-increasing problem.

Different problems can arise in the accuracy of the clock signal. Variations in timing between successive 5 rising edges (or falling edges), i.e., the overall cycle variation (often referred to as "jitter") typically relates to the oscillator. Variations in the duty cycle (the portion of the overall cycle in which the signal is "on"), i.e., between a rising edge and the next falling edge, typically relate to the clock distribution network, although variations in the duty cycle can also be caused by the oscillator. Clock distribution networks use various elements such as buffers and inverters, often cascaded. These networks can introduce duty cycle distortion due to circuit and interconnect modeling inaccuracies, process variations, and the environment.

For systems which use both the rising and falling edges for timing, a non-optimal clock duty cycle may require a lower clock frequency, reducing performance. A duty cycle error of just 5% for instance (from 50% to 45%) may require a system clock to run at a maximum speed that is 10% lower, causing a significant impact on system performance. Many circuits require a specific duty cycle for clocking signals to provide optimal performance. For example, multi-phase clocking systems often require a symmetrical wave shape that is characteristically desired to operate at a 50% duty cycle. Some applications require a duty cycle other than 50%. One use of non-50% duty cycles is in digital clocking where pulse-mode latching is used rather than edge-latching in order to reduce the setup-hold overhead associated with the latches.

Actual duty cycles typically do not have precisely the desired value. Even if a clock signal has the required duty cycle at some point in the system (e.g., at the output of an on-chip voltage-controlled oscillator), the duty cycle will deviate from the required percentage as the clock signal is buffered and distributed throughout the chip. Different approaches have been devised to actively control the duty cycle. Most of these approaches involve measurement of the error in the duty cycle, and provision of a correction signal to reduce that error.

For example, Gronowski et al., in "A 433 MHz 64b Quad-Issue RISC Microprocessor," ISSCC Digest, pp. 222–223 (February 1996), describe a technique in which the duty cycle is monitored and a feedback mechanism changes the delay in an off-chip clock receiver circuit. In the article by Nakamura et al., "A CMOS 50% Duty Cycle Repeater Using Complementary Phase Blending," VLSI Circuits Digest, pp. 48–49 (June 2000), a system is disclosed requiring two clock phases for a unique "phase-blending" mechanism. Another system, disclosed in Jung et al., "A Low-Jitter Dual Loop DLL Using Multiple VCDLs With a Duty Cycle Corrector," VLSI Circuits Digest, pp. 50–51 (June 2000), also requires two clock phases. That design, however, utilizes a feedback control architecture as well. In U.S. Pat. No. 5,491,440, a circuit compares the average output value of a monostable multivibrator with a reference voltage, and increments or decrements a counter which drives a data port on the monostable multivibrator. U.S. Pat. No. 6,084,452 describes a clock duty cycle control technique which compares a reference voltage generated by $V_{dd}$ and ground, and a comparison signal using feedback. The adjustment circuit uses differential amplifiers to shift a reference voltage for adjustment of the duty cycle of the VCO signal.

All of the foregoing techniques add a new level of complexity to the clock distribution scheme. All of these techniques also apply to bulk semiconductor technology, and may be unsuitable for other fabrication methodologies, such as a silicon-on-insulator (SOI) process. It would, therefore, be desirable to devise an improved clock distribution network having a more consistent and accurate duty cycle. It would be further advantageous if the duty cycle adjustment could be accomplished without significantly adding to the complexity of the distribution network.

SUMMARY OF THE INVENTION

It is therefore one object of the present invention to provide improved clocking control for a synchronized electronic system.

It is another object of the present invention to provide an improved clock distribution network which reduces duty cycle variations.

It is yet another object of the present invention to provide such an improved clock distribution network which dynamically adjusts the duty cycle without adding significant expense.

The foregoing objects are achieved in a method of controlling a clock signal for an electronic system, generally comprising the steps of detecting an error in a duty cycle of a clock signal in a clock distribution network of the electronic system, and dynamically adjusting a body voltage of at least one electronic device in the clock distribution network, based on the detected error. Where the electronic device is a p-type device, the adjustment may be performed by reducing the body voltage of the p-type device with respect to a supply voltage. Where the electronic device is an n-type device, the adjustment may be performed by increasing the body voltage of the n-type device with respect to a reference plane. For example, if the clock distribution network includes an inverter chain having a plurality of inverters, wherein each of the inverters has at least one p-type device and one n-type device, the adjustment may be performed by adjusting the body voltages of the p-type devices in odd-numbered ones of the inverters while adjusting the body voltages of the n-type device in even-numbered ones of the inverters to affect a falling edge of the clock signal, and adjusting the body voltages of the p-type devices in even-numbered ones of the inverters while adjusting the body voltages of the n-type device in odd-numbered ones of the inverters to affect a rising edge of the clock signal.

In one implementation, the body voltage of the electronic device is adjusted by selectively connecting a body contact of the device to one of a plurality of discrete voltages using a multiplexer. If the electronic device is a p-type device, the body contact may be connected to one of a plurality of power supplies and, if the electronic device is an n-type device, the body contact may be connected to one of a plurality of reference planes. Alternatively, the invention may be implemented in an analog fashion, such as by applying an analog signal to the body contact, wherein the analog signal is generated using an asymmetric charge-pump and filter connected to the clock signal.

The above as well as additional objectives, features, and advantages of the present invention will become apparent in the following detailed written description.

DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DESCRIPTION OF PREFERRED EMBODIMENT

The present invention is directed to a novel method and system for dynamically adjusting the duty cycle of a clock signal in a clock distribution network. The body voltage of a device (or group of devices) in the clock distribution network is manipulated to adjust the duty cycle of a microprocessor system clock which has deteriorated from its desired value (e.g., 50%) after going through the clock distribution network.

Reducing the body voltage of a p-type field-effect transistor (PFET) with respect to its supply voltage ($V_{dd}$) reduces the magnitude of the threshold voltage for the device, causing its conduction state to begin earlier when it is switched from OFF-to-ON, and also causing the conduction state to persist longer when the device is switched from ON-to-OFF. The threshold voltage of an n-type field-effect transistor (NFET) is reduced when its body voltage is increased with respect to electrical ground, exhibiting the same kind of conduction state stretching/shrinking phenomena as the PFET.

Figure 1:
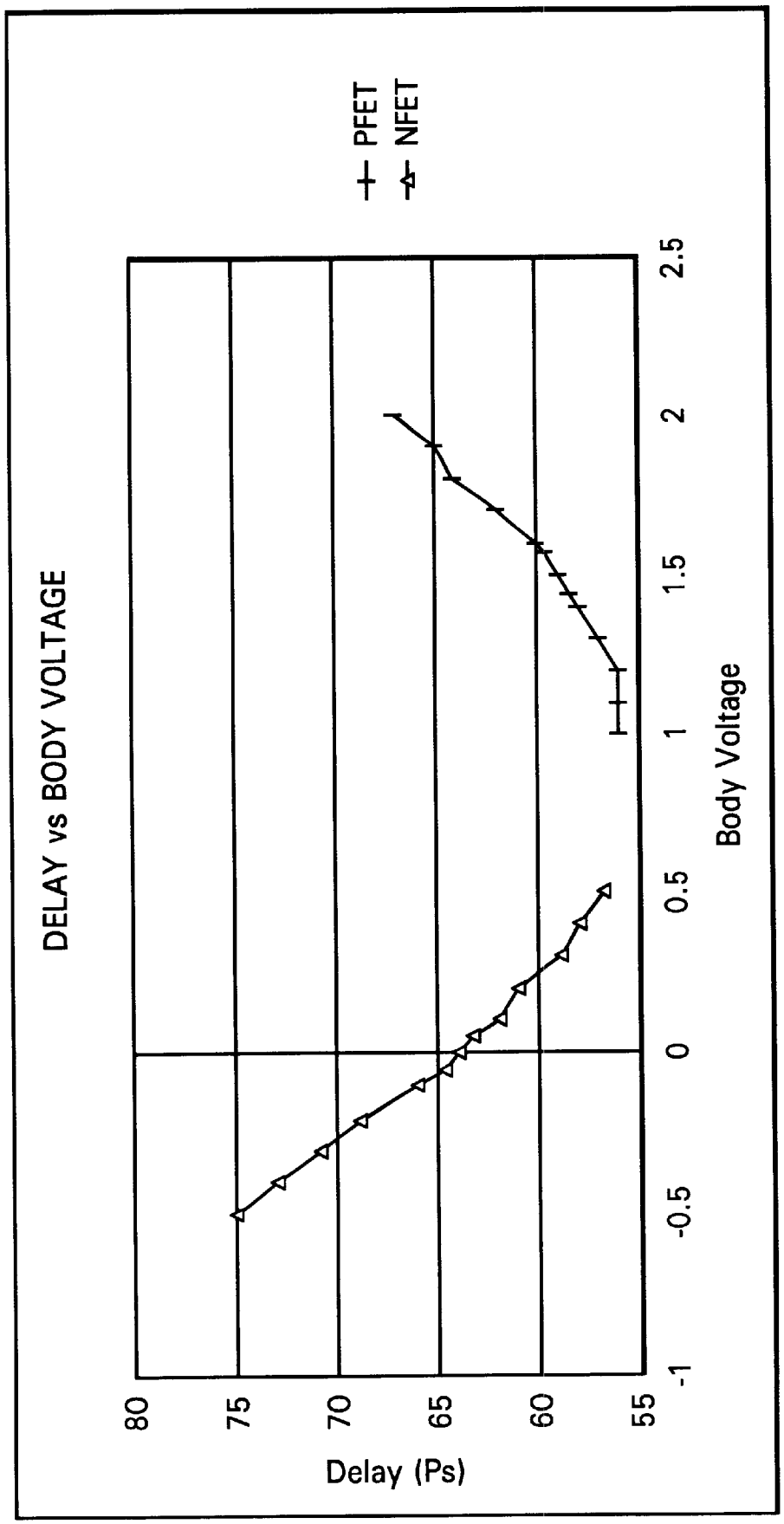
FIG. 1 is a graph illustrating the relationship between device delay and body voltage, for both a p-type field-effect transistor (PFET) and an n-type field-effect transistor (NFET), which relationship is utilized in adjusting the duty cycle of a clock distribution network according to the present invention.

FIG. 1 shows the OFF-to-ON delay for a typical PFET and a typical NFET as a function of the body voltage. By sensing the duty cycle of the clock at the point-of-use, control signals may be generated which may be used to adjust device thresholds in the clock distribution in such a way that the duty cycle is adjusted towards its optimum value.

Figure 2:
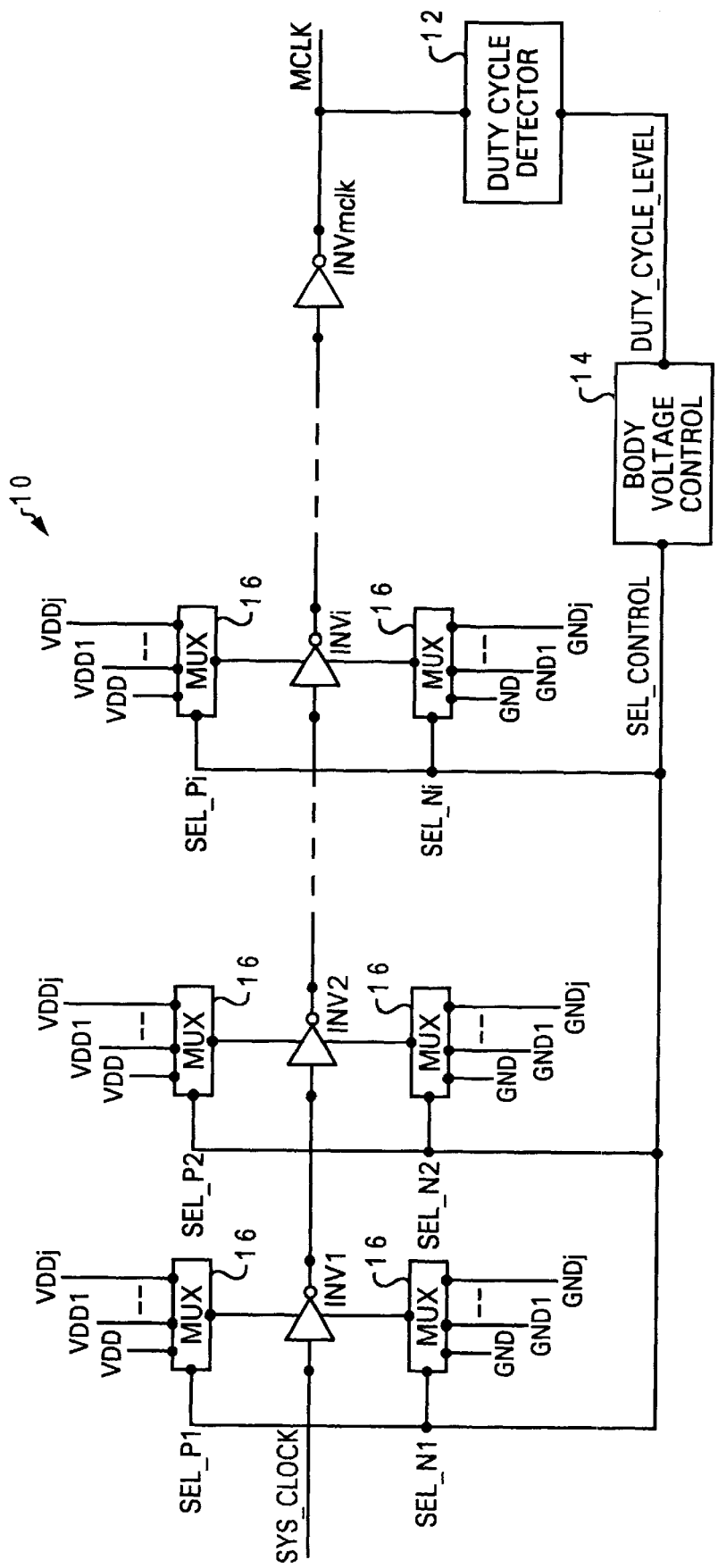
FIG. 2 is a block diagram of a portion of one embodiment of a clock distribution network having a series of inverters, wherein the body voltages of the inverter devices are altered to adjust the duty cycle of a clock signal passing through the inverters.

FIG. 2 shows a local clock signal MCLK, whose duty cycle is adjusted through a series of inverters, INV1 to INVi, in one embodiment of a clock distribution network 10 constructed in accordance with the present invention. A duty cycle detector 12 is used to measure the duty cycle of MCLK. Within a certain tolerance, duty cycle detector 12 tells body voltage control logic 14 either to increase or decrease the clock pulse width, through the DUTY_CYCLE_LEVEL signal. Body voltage control 14 keeps track of the body voltage of all the p- and n-devices of INV1 to INVi, and changes them according to the DUTY_CYCLE_LEVEL signal.

Each device in the inverter chain, INV1 to INVi, can be connected to a range of discrete voltages using multiplexer 16. For p-type devices, the body voltage can be selected by SEL_P1 to SEL_Pi to be $V_{dd}$ or $V_{dd1}$ to $V_{ddj}$. For n-type devices, the body voltage can be selected by SEL_N1 to SEL_Ni to be GND or GND1 to GNDj (i.e., different reference planes). The p-type device of an odd-numbered inverter INV1, INV3, etc. (INVodd) and the n-type device of an even-numbered INV2, INV4, etc. (INVeven) affect the falling edge of the clock pulse. Similarly, the n-type device of an INVodd and the P device of an INVeven affect the rising edge of the clock signal.

Body voltage control 14 can manipulate the clock pulse through a range of body voltages, p-type and n-type devices, and either or both edges of the pulse, using multiplexers 16. The number of discrete body voltages available via the multiplexors can be varied according to the design requirements and specifications.

Figure 3:
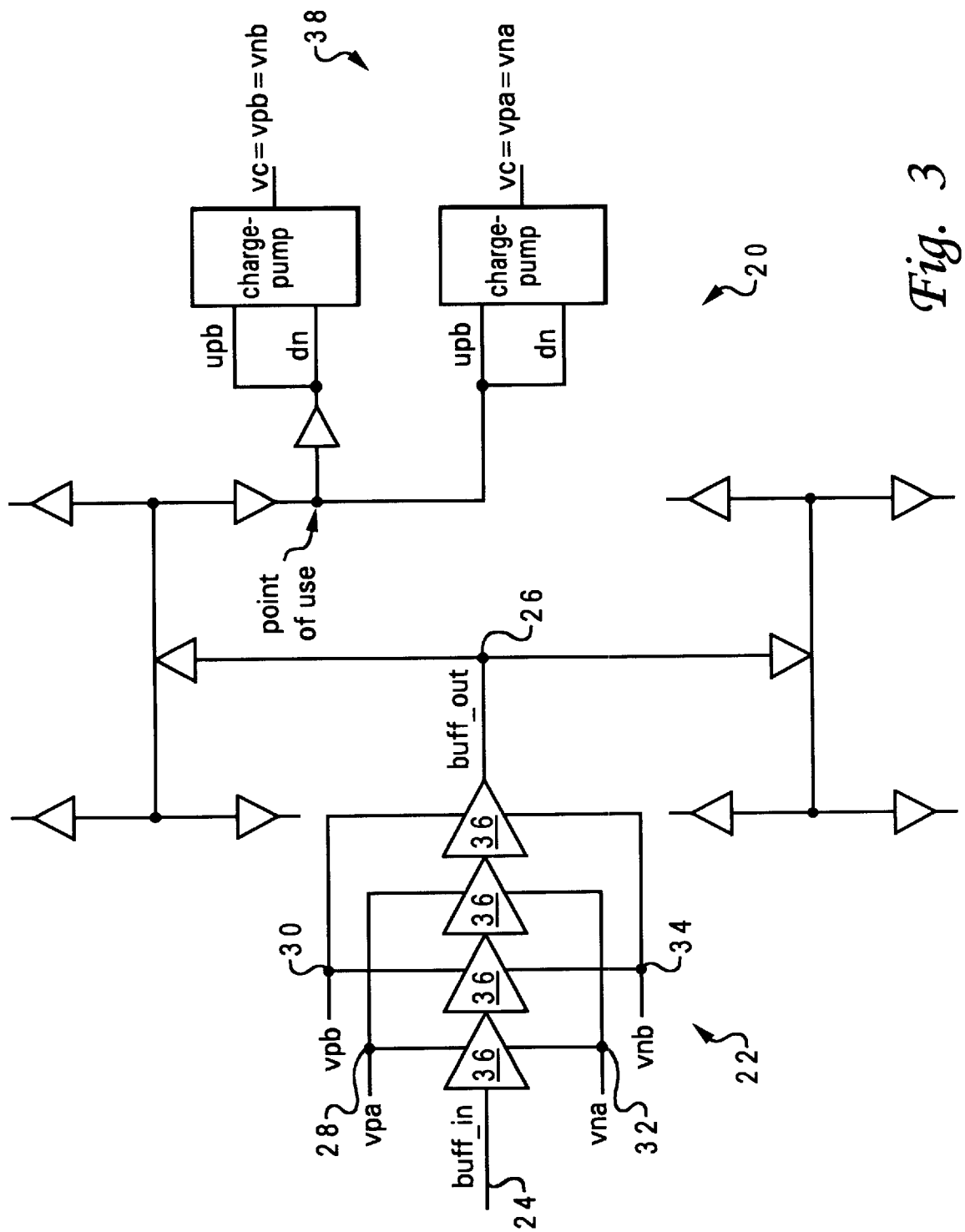
FIG. 3 is a block diagram of an analog implementation of a clock distribution network constructed in accordance with the present invention.

FIG. 3 shows a block diagram of an analog implementation for a microprocessor clock distribution network 20 with duty-cycle correction. A 4-stage central clock buffer 22 has clock signal input/output pins buff_in 24 and buff_out 26, PFET body contacts vpa 28, vpb 30, and NFET body contacts vna 32, vnb 34. Since the buffers 36 invert the signal, the body contacts must skip every other stage. The output of central clock buffer 22 is distributed via conventional techniques, e.g., H-tree, grid, or hybrid.

An asymmetric charge-pump and filter 38 (shown in further detail in FIG. 5) may be connected to the clock signal at the point of use in the system for generating the body voltage control signals for the odd stages, while the inverted clock signal is used to generate the body voltage control for the even stages. Although FIG. 3 shows a preferred embodiment for global duty-cycle correction, the technique could be used for local correction as well by employing this technique at or near the final buffering stages of a distribution network, and could be used for intentional skewing of duty cycle from 50% as well (e.g., to 40%).

Figure 4:
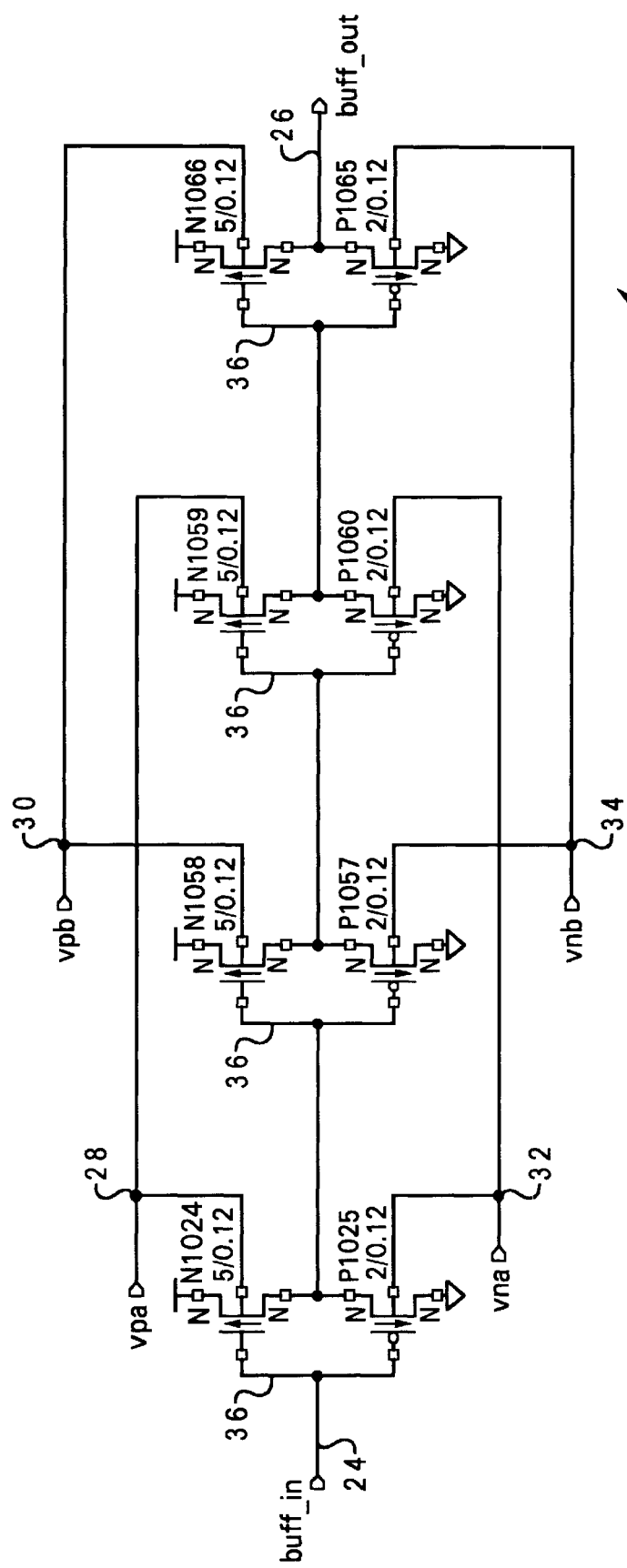
FIG. 4 is a detailed schematic diagram depicting a central clock buffer with body voltage contacts fabricated using silicon-on-insulator (SOI) technology.

FIG. 4 is a detailed circuit schematic illustrating how central clock buffer 22 is formed with the body voltage contacts using silicon-on-insulator (SOI) technology. For bulk technologies, a similar technique could be employed using only the NWELL contacts of the PFET devices.

Figure 5:
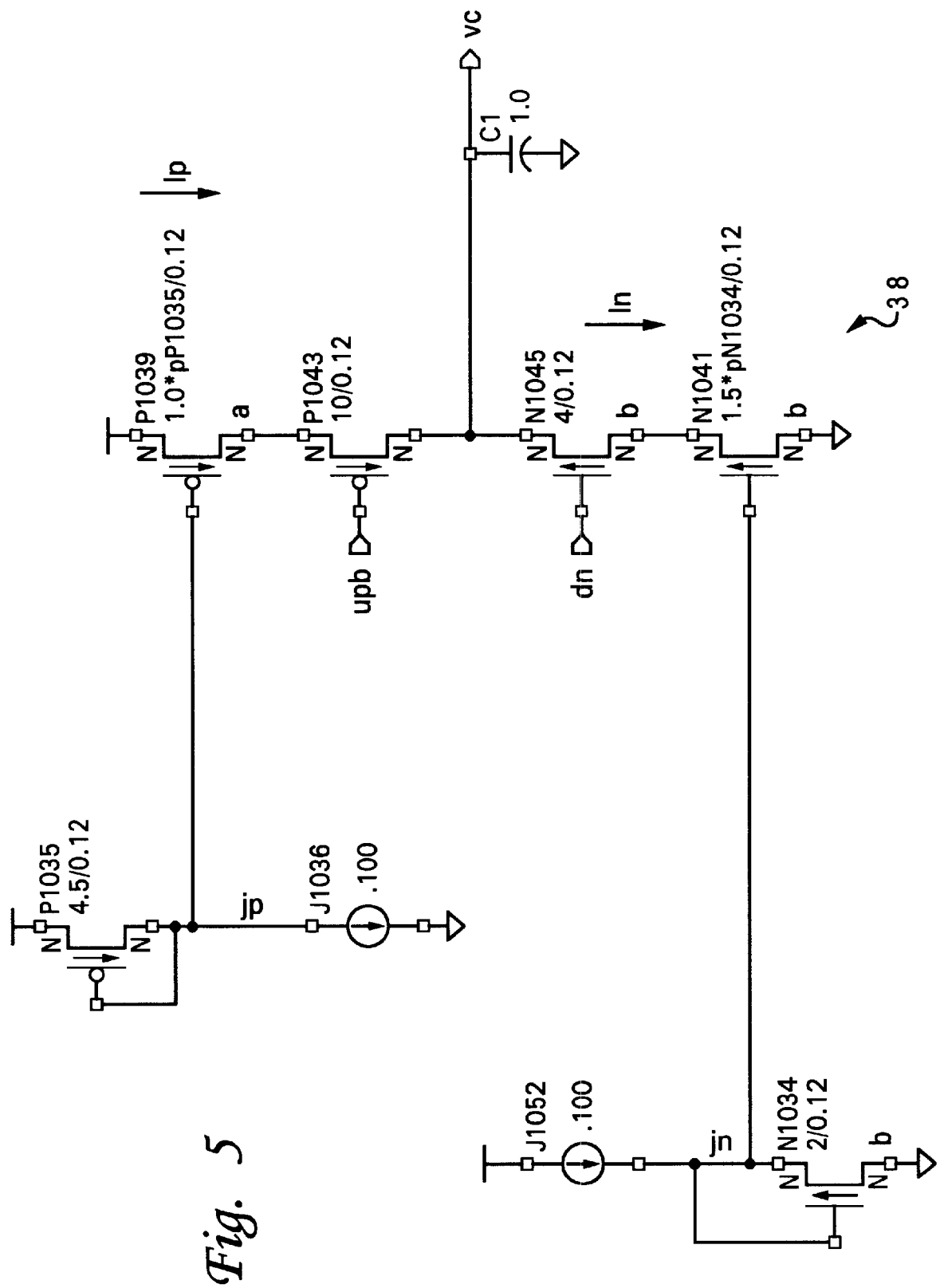
FIG. 5 is a detailed schematic diagram illustrating one embodiment of an asymmetric charge pump and filter which is used to generate body voltage control signals for certain stages of the clock distribution network in accordance with the present invention.

FIG. 5 is another detailed circuit schematic illustrating an exemplary embodiment of asymmetric charge pump and filter 38. As the output voltage VC moves towards $V_{dd}$ (or towards ground), the current in the PFET current source (or NFET current sink) is gradually reduced as the voltage is reduced, eventually reaching a steady-state value. The ratio of the filter's source current $I_p$ to sink current $I_n$ can be adjusted in the design by current mirror ratios; this example shows a reference current of 100 μA with 1:1 mirroring for the source current and 1:1.5 mirroring (i.e., 150 μA) for the sink current. These ratios can be fixed within the design or adjusted by means of a scan chain, fusible link, or other program means. An integrating network with appropriate level shifting functions could be substituted for the charge-pump and filter described herein.

Figure 6:
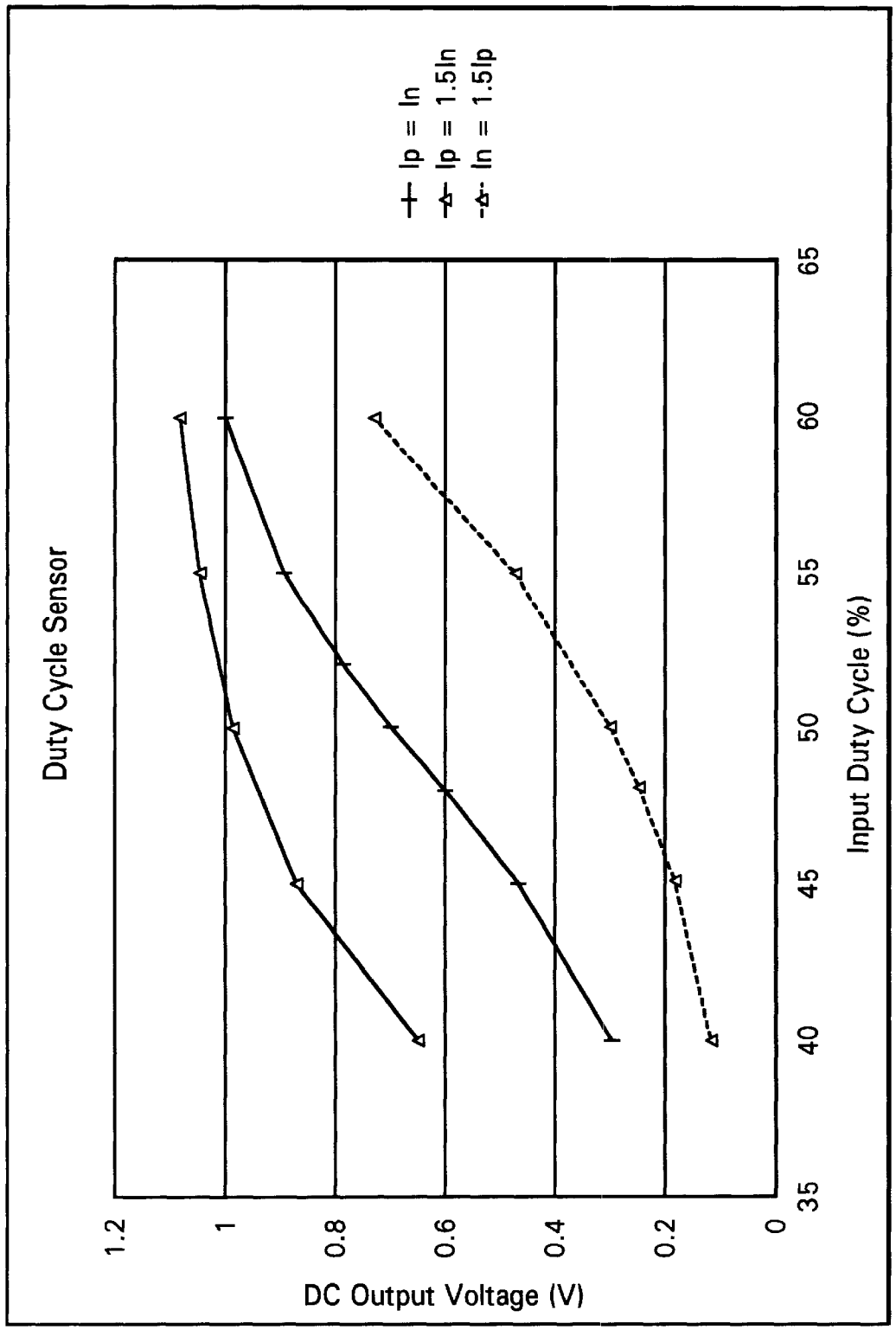
FIG. 6 is a graph showing simulated results for the DC output voltage of the asymmetric charge pump and filter of FIG. 5 as a function of the input duty cycle.

FIG. 6 is a graph of simulation results for the circuit in FIG. 5. Shown are three DC output voltage curves as a function of clock duty cycle for a balanced sink/source current ratio ($I_p=I_n$), a 1.5:1 ratio ($I_p=1.5I_n$), and a 1:1.5 ($I_n=1.5I_p$) ratio. At 50% duty cycle the PFET and NFET body voltage signals are approximately 0.95 V and 0.3 V, respectively. As the duty cycle is reduced, both body control voltages are reduced, lowering the magnitude of the threshold for the buffer's PFET's (expanding their conduction range) and increasing the threshold of the buffer's NFET's (shrinking their conduction range). An increasing duty cycle increases the control voltages, and causes a shrinking PFET conduction range and an expanding NFET range.

The present invention thus requires little overhead in addition to conventional non-correcting means, since existing clock buffers may be used with additional body contacts. It is relatively straightforward to modify conventional charge pumps to become asymmetrical. Existing designs can be therefore modified without significant impact, but still provide a consistently accurate duty cycle.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of controlling a clock signal for an electronic system, comprising the steps of:
   detecting an error in a duty cycle of a clock signal in a clock distribution network of the electronic system; and
   dynamically adjusting, to any one of at least three voltages, a body voltage of at least one electronic device in the clock distribution network, based on the detected error.

2. The method of claim 1 wherein:
   the electronic device is a p-type device; and
   said adjusting step includes the step of reducing the body voltage of the p-type device with respect to a supply voltage.

3. The method of claim 1 wherein:
   the electronic device is an n-type device; and
   said adjusting step includes the step of increasing the body voltage of the n-type device with respect to a reference plane.

4. The method of claim 1 wherein:
   the clock distribution network includes an inverter chain having a plurality of inverters;
   each of the inverters has at least one p-type device and one n-type device; and
   said adjusting step includes the steps of
      adjusting the body voltages of the p-type devices in odd-numbered ones of the inverters while adjusting the body voltages of the n-type device in even-numbered ones of the inverters to affect a falling edge of the clock signal, and
      adjusting the body voltages of the p-type devices in even-numbered ones of the inverters while adjusting the body voltages of the n-type device in odd-numbered ones of the inverters to affect a rising edge of the clock signal.

5. The method of claim 1 wherein said adjusting step includes the step of connecting a body contact of the electronic device to one of a plurality of discrete voltages using a multiplexer.

6. The method of claim 5 wherein:
   the electronic device is a p-type device; and
   said adjusting step selectively connects a body contact of the p-type device to one of a plurality of power supplies.

7. The method of claim 5 wherein:
   the electronic device is an n-type device; and
   said adjusting step selectively connects a body contact of the n-type device to one of a plurality of reference planes.

8. The method of claim 1 wherein said adjusting step includes the step of applying an analog signal to a body contact of the electronic device.

9. The method of claim 8 further comprising the step of generating the analog signal using an asymmetric charge-pump and filter connected to the clock signal at a point of use.

10. A circuit for controlling a clock signal of an electronic system, comprising:
    a clock distribution network having a clock input and a clock output;
    means for detecting an error in a duty cycle of a clock signal at said clock output; and
    means for dynamically adjusting, to any one of at least three voltages, a body voltage of at least one electronic device in said clock distribution network, based on the detected error.

11. The circuit of claim 10 wherein the electronic device is a silicon-on-insulator device.

12. The circuit of claim 10 wherein:
    said electronic device is a p-type device; and
    said adjusting means includes means for reducing the body voltage of said p-type device with respect to a supply voltage.

13. The circuit of claim 10 wherein:
    said electronic device is an n-type device; and
    said adjusting means includes means for reducing the body voltage of said n-type device with respect to a reference plane.

14. The circuit of claim 10 wherein:
    said clock distribution network includes an inverter chain having a plurality of inverters;
    each of said inverters has at least one p-type device and one n-type device; and said adjusting means adjusts the body voltages of said p-type devices in odd-numbered ones of said inverters while adjusting the body voltages of said n-type device in even-numbered ones of said inverters to a falling edge of the clock signal, and further adjusts the body voltages of said p-type devices in even-numbered ones of said inverters while adjusting the body voltages of said n-type device in odd-numbered ones of said inverters to affect a rising edge of the clock signal.

15. The circuit of claim 10 wherein said adjusting means includes a multiplexer which selectively connects a body contact of said electronic device to one of a plurality of discrete voltages.

16. The circuit of claim 15 wherein:
said electronic device is a p-type device; and
said multiplexer selectively connects said body contact of said p-type device to one of a plurality of power supplies.

17. The circuit of claim 15 wherein:
said electronic device is an n-type device; and
said multiplexer selectively connects said body contact of said n-type device to one of a plurality of reference planes.

18. The circuit of claim 10 wherein said adjusting means includes means for applying an analog signal to a body contact of said electronic device.

19. The circuit of claim 18 wherein said applying means includes an asymmetric charge-pump and filter connected to the clock output.

* * * * *

UNITED STATES PATENT AND TRADEMARK OFFICE
CERTIFICATE OF CORRECTION

PATENT NO. : 6,501,313 B2
DATED : December 31, 2002
INVENTOR(S) : Boerstler et al.

It is certified that error appears in the above-identified patent and that said Letters Patent is hereby corrected as shown below:

<u>Column 7,</u>
Line 4, after the words "of said inverters to" please insert the word -- affect --.

Signed and Sealed this

Second Day of September, 2003

JAMES E. ROGAN
*Director of the United States Patent and Trademark Office*